(12) United States Patent
Lai et al.

(10) Patent No.: US 11,011,989 B2
(45) Date of Patent: May 18, 2021

(54) POWER SUPPLY CIRCUIT AND METHOD OF OPERATION THEREOF

(71) Applicant: DELTA ELECTRONICS, INC., Taoyuan (TW)

(72) Inventors: Wei-Hsun Lai, Taoyuan (TW); Chien-Yu Wang, Taoyuan (TW); Po-Cheng Chiu, Taoyuan (TW); Wei-Cheng Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 1 day.

(21) Appl. No.: 16/745,311

(22) Filed: Jan. 16, 2020

(65) Prior Publication Data

US 2020/0412244 A1     Dec. 31, 2020

(30) Foreign Application Priority Data

Jun. 26, 2019   (CN) .......................... 201910559569.4

(51) Int. Cl.
*H02M 3/158*     (2006.01)
*H01J 37/34*     (2006.01)

(52) U.S. Cl.
CPC ......... *H02M 3/158* (2013.01); *H01J 37/3444* (2013.01)

(58) Field of Classification Search
CPC ...... H02M 3/155; H02M 3/156; H02M 3/158; H02M 3/1588; H01J 37/34; H01J 37/3411; H01J 37/3444
See application file for complete search history.

(56) References Cited

U.S. PATENT DOCUMENTS

| 5,810,982 | A | 9/1998 | Sellers |
| 8,749,210 | B1 * | 6/2014 | Nakao ................. H02M 1/4225 323/225 |
| 9,806,526 | B2 * | 10/2017 | Li ....................... H02M 3/1582 |
| 2006/0087244 | A1 | 4/2006 | Regan |
| 2014/0056045 | A1 * | 2/2014 | Yan ....................... H02M 7/217 363/126 |
| 2016/0065047 | A1 * | 3/2016 | Seaberg ................. H02M 1/32 327/109 |
| 2016/0308445 | A1 * | 10/2016 | King ..................... H02M 3/158 |
| 2017/0302179 | A1 * | 10/2017 | Bandyopadhyay ..... H02M 1/08 |

FOREIGN PATENT DOCUMENTS

| CN | 207038478 U | 2/2018 |
| TW | M322611 U | 11/2007 |

* cited by examiner

*Primary Examiner* — Matthew V Nguyen
(74) *Attorney, Agent, or Firm* — CKC & Partners Co., LLC

(57) ABSTRACT

A power supply circuit includes an energy storage element, a first switch, a voltage signal converter, a second switch, a third switch and a power supply. The first switch is coupled to the energy storage element at a first voltage output terminal. The voltage signal converter is coupled to, respectively, the energy storage element and the first switch at a first converter output terminal and a second converter output terminal. The second switch is coupled to the first switch. The third switch is coupled to the second switch at a second voltage output terminal. The power supply is coupled to the second switch and the third switch. The energy storage element, the first switch, the voltage signal converter, the second switch, the third switch and the power supply cooperate and generate a output voltage. A method of operating the power supply circuit is also disclosed herein.

20 Claims, 4 Drawing Sheets

POWER SUPPLY CIRCUIT AND METHOD OF OPERATION THEREOF

RELATED APPLICATIONS

The present application claims priority to China Application Serial Number 201910559569.4 filed on Jun. 26, 2019, which is herein incorporated by reference in its entirety.

BACKGROUND

Description of Related Art

In the plasma system (such as sputtering, etching, etc.) of the current semiconductor manufacture process, the current technology implements a negative voltage power supply and a dependent positive voltage power supply in equal proportions thereto as an output pulse power supply to periodically suppress the arc generated on the surface of the target. However, for the application in which the voltage level of the positive voltage source needs to be adjusted to meet the requirements of different processes and sputtering materials, the output positive voltage with fixed voltage ratio and pulse frequency, provided in conventional art, cannot effectively suppress the generation of the arc and cause slow sputtering rate and poor film quality.

SUMMARY

One aspect of the present disclosure is to provide a power supply circuit. The power supply circuit comprises an energy storage element, a first switch, a voltage signal converter, a second switch, a third switch and a power supply. A first terminal of the first switch is coupled to a first terminal of the energy storage element at a first voltage output terminal. The voltage signal converter comprises a first converter output terminal and a second converter output terminal, wherein a second terminal of the energy storage element is coupled to the first converter output terminal, and a second terminal of the first switch is coupled to the second converter output terminal. A first terminal of the second switch is coupled to the second terminal of the first switch. A first terminal of the third switch is coupled to a second terminal of the second switch at a second voltage output terminal. A first terminal of the power supply is coupled to the first terminal of the second switch, and a second terminal of the power supply is coupled to the second terminal of the third switch. The energy storage element, the first switch, the second switch, the third switch, the voltage signal converter and the power supply are configured to cooperate to generate an output voltage at the first voltage output terminal and the second voltage output terminal.

Another aspect of the present disclosure is to provide a power supply circuit. The power supply circuit comprises an energy storage element, a first switch, a power supply, a second switch and a third switch. The energy storage element is configured to receive an output voltage from a voltage signal converter and generate a storage voltage. The first switch is coupled to the energy storage element at a first voltage output terminal. The power supply is configured to generate a supply voltage. The second switch is coupled between the power supply and a second voltage output terminal. The third switch is coupled to the second switch at the second voltage output terminal, and coupled to the power supply and the first switch. The first switch, the second switch, and the power supply form a first power loop which outputs the supply voltage between the first voltage output terminal and the second voltage output terminal. The voltage signal converter, the energy storage element, and third switch form a second power loop which outputs the storage voltage between the first voltage output terminal and the second voltage output terminal.

Another aspect of the present disclosure is to provide a method of operating a power supply circuit, the method comprising the following steps: by a control signal generating circuit, generating a first control signal, a second control signal and a third control signal; and in response to the first control signal, the second control signal and the third control signal respectively, a first switch, a second switch and a third switch being turned on selectively; wherein when the first switch and the third switch are turned off and the second switch is turned on in response to the second control signal, an energy storage element outputs a negative voltage as an output voltage through the second switch and the energy storage element, and when the second switch is turned off, the first switch and the third switch are turned on in response to the first control signal and the third control signal respectively, a positive voltage is outputted as the output voltage by a power supply through the first switch and the third switch.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The spirit of the present disclosure will be discussed in the following drawings and detailed description, and those of ordinary skill in the art will be able to change and modify the teachings of the present disclosure without departing from the spirit and scope of the present disclosure.

It should be understood that, in this document and the following claims, when an element is referred to as being "connected" or "coupled" to another element, it can be directly connected or coupled to another element, or there may be an intervening component. In contrast, when an element is referred to as being "directly connected" or "directly coupled" to another element, there is no intervening element. In addition, "electrically connected" or "connected" may also be used to indicate that two or more elements cooperate or interact with each other.

It should be understood that, in this document and the following claims, the terms "first" and "second" are to describe the various elements. However, these elements should not be limited by these terms. These terms are used to distinguish one element from another. For example, a first element may be termed a second element. Similarly, a second element may be termed a first element without departing from the spirit and scope of the embodiments.

It should be understood that, in this document and the following claims, the terms "include," "comprise," "having" and "has/have" are used in an open-ended fashion, and thus should be interpreted to mean "include, but not limited to."

It should be understood that, in this document and the following claims, the term "and/or" includes any and all combinations of one or more of the associated listed items.

It should be understood that, in this document and the following claims, Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Any element in the claim should not be construed as a means of function, unless it is explicitly stated that the device is used to perform a particular function, or that the steps are used to perform a particular function.

The present disclosure provides a power supply circuit and a method of operation thereof. The power supply circuit can be used in some embodiments for a sputtering system to provide a tunable positive voltage output pulse power supply, accompanying three switching elements with the energy storage element to achieve good arc suppression.

Figure 1:
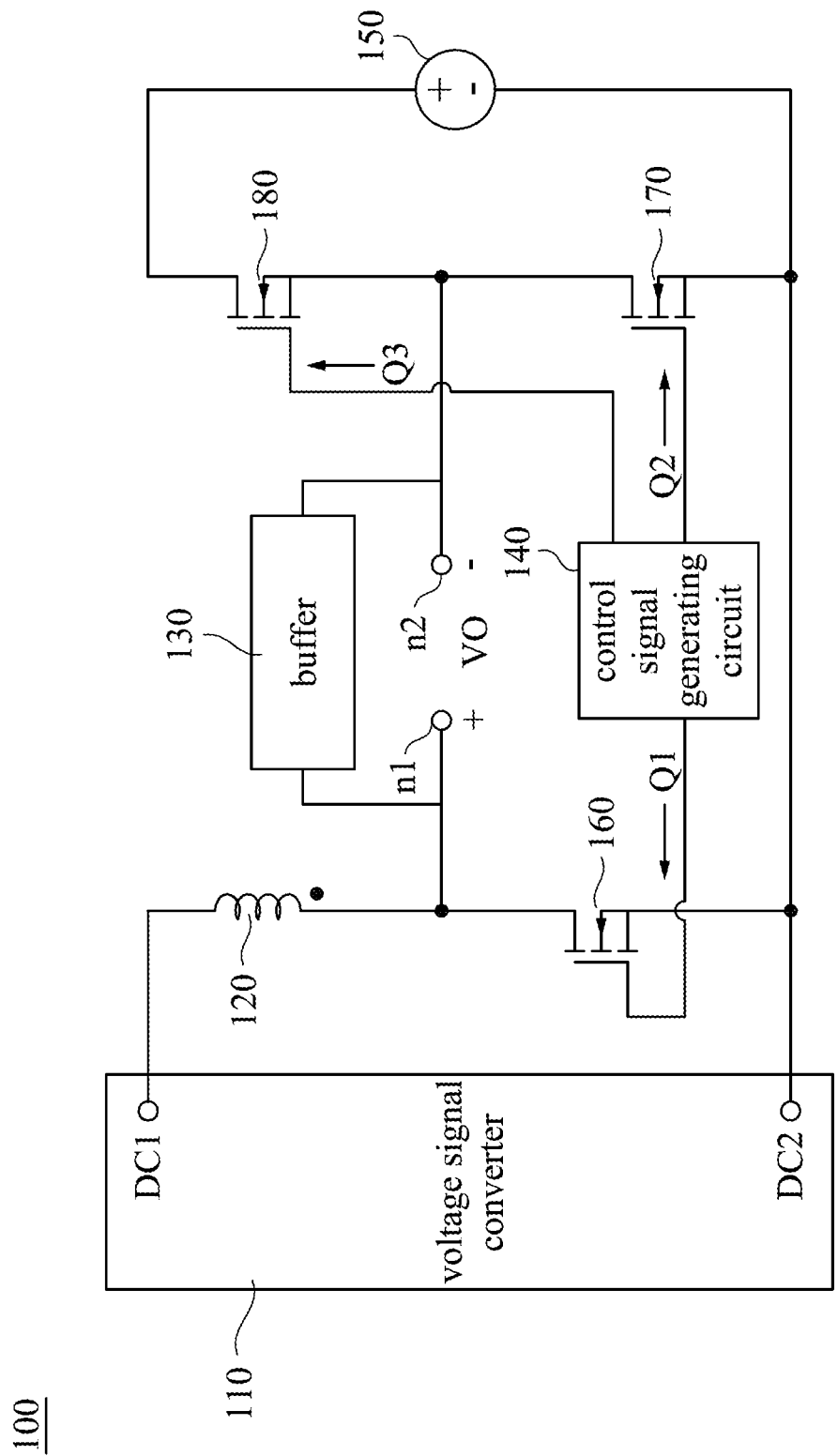
FIG. 1 is a schematic diagram of a power supply circuit, in accordance with some embodiments of the present disclosure.

Reference is now made to FIG. 1. FIG. 1 is a schematic diagram of a power supply circuit 100, in accordance with some embodiments of the present disclosure. The power supply circuit 100 includes a voltage signal converter 110, an energy storage element 120, a buffer 130, a control signal generating circuit 140, a power supply 150, and switches 160, 170 and 180. In some embodiments, the voltage signal converter 110 can be a DC-to-DC converter, an AC-to-DC converter, or any of the devices that can be configured to convert the input voltage to another DC power source of different voltages. The energy storage element 120 can include at least one inductor. The buffer 130 can be a buffer circuit, a snubber, or any of circuit configured to suppress the transient voltage to achieve the effect of the optimization of pulse waves. The switches 160, 170 and 180 can be implemented by transistors or can be any component that can implement a switching function.

As shown in FIG. 1, in some embodiments, the voltage signal converter 110 includes a first converter output terminal DC1 and a second converter output terminal DC2. In the connection relationship, the first terminal of the switch 160 and the first terminal of the energy storage element 120 are coupled at the first voltage output terminal n1. The second terminal of the energy storage element 120 is coupled to the first converter outputs terminal DC1 of the voltage signal converter 110. The second terminal of the switch 160 is coupled to the second converter output terminal DC2 of the voltage signal converter 110. The first terminal of the switch 170 is coupled to the second terminal of the switch 160. The first terminal of the switch 180 and the second terminal of the switch 170 are coupled at the second voltage output terminal n2. The first terminal of the power supply 150 is coupled to the first terminal of the switch 170. The second terminal of the power supply 150 is coupled to the second terminal of the switch 180. The buffer 130 is coupled between the first voltage output terminal n1 and the second voltage output terminal n2. The control signal generating circuit 140 is coupled to a control terminal of each of the switches 160, 170 and 180.

In some embodiments, the voltage signal converter 110 is configured to output a voltage signal, and the voltage signal can be a negative voltage. The energy storage element 120 is configured to receive the voltage signal from the voltage signal converter 110 and configured to generate a storage voltage. The power supply 150 is configured to generate a supply voltage, and the power supply 150 can be, for example, a voltage supply unit to generate a positive voltage. The control signal generating circuit 140 is configured to generate the control signals Q1, Q2 and Q3, in which the switch 160 can be switched in response to the control signal Q1, the switch 170 can be switched in response to the control signal Q2, and the switch 180 can be switched in response to the control signal Q3, such that the energy storage element 120, the switches 160, 170, 180 and the power supply 150 can be configured to cooperate to generate an output voltage VO at the first voltage output terminal n1 and the second voltage output terminal n2. In some embodiments, the control signals Q1, Q2, and Q3 can be pulse width modulation (PWM) signals.

Figure 2:
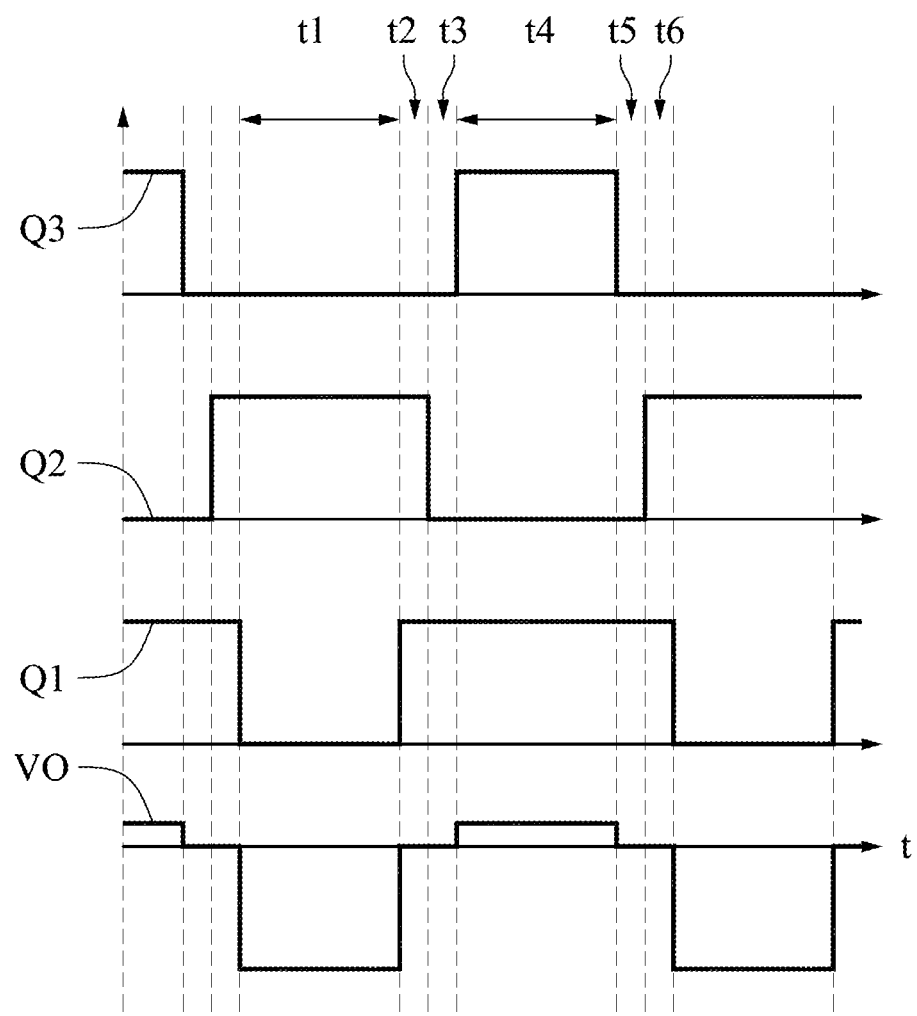
FIG. 2 is a schematic diagram illustrating a plurality of control signals and an output voltage, in accordance with some embodiments of the present disclosure.
Figure 3:
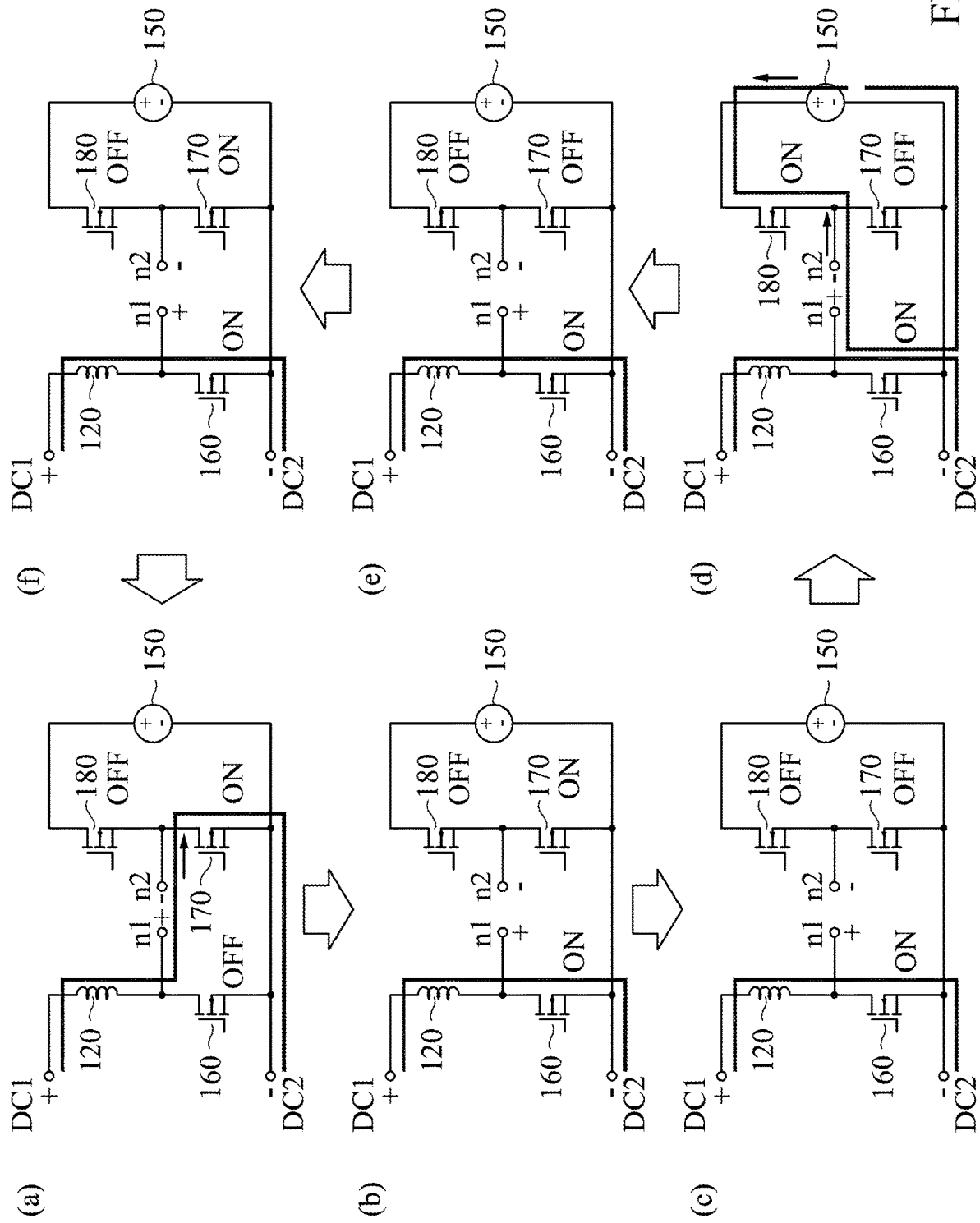
FIG. 3 is a schematic diagram illustrating operations of a power supply circuit, in accordance with some embodiments of the present disclosure.
Figure 4:
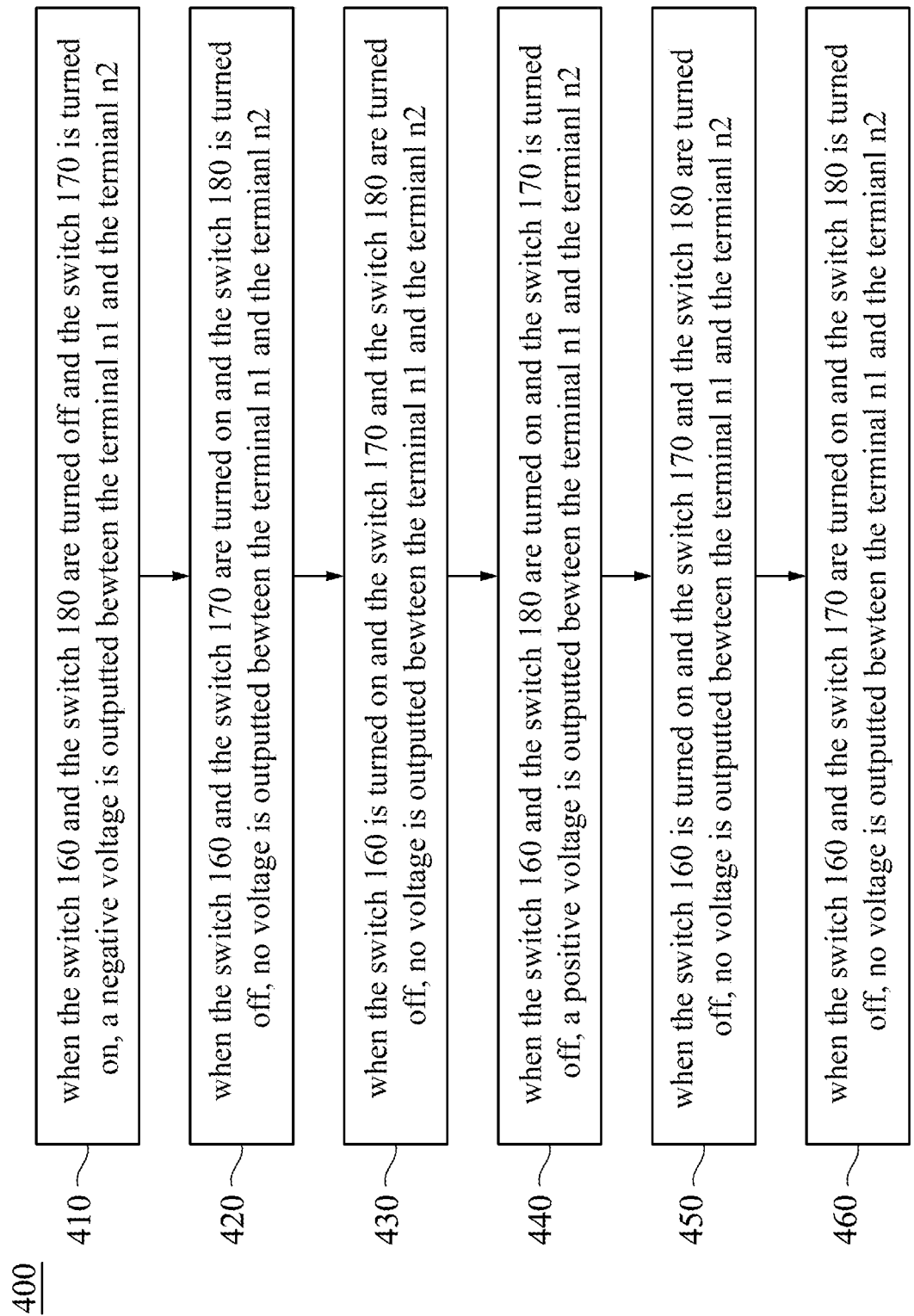
FIG. 4 is a flow chart of a method of operating a power supply circuit, in accordance with some embodiments of the present disclosure.

To explain the operation of the power supply circuit 100 in more detail, reference is made to FIG. 2, FIG. 3 and FIG. 4. FIG. 2 is a schematic diagram illustrating the control signals Q1, Q2 and Q3 and an output voltage VO, in accordance with some embodiments of the present disclosure. FIG. 3 is a schematic diagram illustrating operations of a power supply circuit 100 as shown in FIG. 1, in accordance with some embodiments of the present disclosure. For the sake of understanding, the same elements in FIG. 3 as those in FIG. 1 will be denoted by the same reference marks. The specific operation of similar elements that have been discussed in detail in the above paragraphs is omitted here for the sake of brevity, unless there is a need to explain the cooperative relationship with the elements shown in FIG. 3. In addition, in FIG. 3, for ease of explanation, the voltage signal converter 110, the buffer 130 and the control signal generating circuit 140 are not shown, and the connection relationship is as shown in the embodiment in FIG. 1. FIG. 4 is a flow chart of a method of operating a power supply circuit 400, in accordance with some embodiments of the present disclosure. In some embodiments, the method for operating the power supply circuit 400 as shown in FIG. 4 can be applied to the power supply circuit 100 as shown in FIG. 1, but the present disclosure is not limited thereto.

Reference is now made to FIG. 2, FIG. 3(a) and FIG. 4. In step 410, at time interval t1 (as the embodiment illustrated in FIG. 2), the control signals Q1 and Q3 have a low level and the control signal Q2 has a high level, as in the embodiment shown in the FIG. 3(a). The switches 160 and 180 are turned off in response to the control signals Q1 and Q3, and the switch 170 is turned on in response to the control signal Q2, so that the energy storage element 120, the switch 170 and the voltage signal converter 110 form a power loop. That is, the current output by the voltage signal converter 110 is passed from the first converter output terminal DC1 through the energy storage element 120, the first voltage output terminal n1 flows to the load, and then flows from the second voltage output terminal n2 through the switch 170 to the second converter output terminal DC2. In this configuration, the energy storage element 120 can output the storage voltage as the output voltage VO between the first voltage output terminal n1 and the second voltage output terminal n2. For example, in some embodiments, as in some high power sputter power systems, the voltage signal converter 110 can output a voltage of −20 kV and preload power by the energy storage element 120. When the switches 160 and 180 are switched to be turned off and the switch 170 is turned on, the energy storage element 120 outputs a negative voltage having a level of −20 kV (as shown in FIG. 2 at time interval t1 the output voltage VO has a negative voltage level).

Next, in step 420, as in some embodiments of the present disclosure, at time interval t2, the control signal Q3 has the low level and the control signals Q1 and Q2 have the high level, as in the embodiment shown in FIG. 3(b), the switch 160 is switched from the off state to the on state in response to the control signal Q1, while the switch 170 remains turned on and the switch 180 remains turned off, and no voltage is outputted between the first voltage output terminal n1 and the second voltage output terminal n2. As shown in FIG. 2, the potential of the output voltage VO is 0 Volt.

Furthermore, in step 430, as some embodiments of the present disclosure, at time interval t3, the control signals Q2 and Q3 have the low level and the control signal Q1 maintains having the high level, as in the embodiment shown in FIG. 3(c), the switch 170 is switched from the on state to the off state in response to the control signal Q2, while the switch 160 remains turned on and the switch 180 remains turned off. As in step 420, no voltage is outputted between the first voltage output terminal n1 and the second voltage output terminal n2. As shown in FIG. 2, the potential of the output voltage VO is 0 Volt.

Following step 430, in step 440, at time interval t4, the control signals Q1 and Q3 have the high level and the control signal Q2 has the low level, as in the embodiment shown in FIG. 3(d). The switch 160 and the switch 180 can be switched on in response to the control signals Q1 and Q3. The switch 170 can be switched off in response to the control signal Q2. So that, the power supply 150, the switch 160 and the switch 180 form another power loop, that is, the current output from the power supply 150 flows through the switch 180, the second voltage output terminal n2 to the load, and then flows from the first voltage output terminal n1, and returns to the power supply 150 via the switch 160. In this configuration, the power supply 150 can output the supply voltage as the output voltage VO between the first voltage output terminal n1 and the second voltage output terminal n2. For example, as the positive voltage tunable power supply configured in the high power sputtering power supply system in the foregoing embodiment, the voltage of the power supply 150 can be set, corresponding to the target material property in the sputtering system, to output any positive voltage, for example, 100 Volts. When the switches 160 and 180 are switched on and the switch 170 is switched off, the power supply 150 outputs a positive voltage of 100 Volts (as shown in FIG. 2 at time interval t4, the output voltage VO having positive voltage level). It should be noted that the values of the output voltage of the voltage signal converter 110 and the power supply 150 are given for ease of understanding the present disclosure. But the present disclosure is not limited thereto. Those skilled in the art can set the voltage level of the output positive voltage and the output negative voltage according to the required application, such applications are also within the scope of this present disclosure.

In some embodiments, the positive voltage output by the power supply 150 discussed above can be configured to release positive ions adsorbed on the target during the sputtering process, so that the probability of arcing in the chamber is reduced. Furthermore, in some embodiments, the voltage level of the positive voltage can be modified by the flexible adjustment of power supply based on the applied process or material combination. The generation of the arc in the chamber can be suppressed to avoid the surface of the film on the object being filled with small holes, so that the quality of the sputtering is enhanced.

In addition, as in the embodiment above, when the positive voltage is outputted through the power loop formed of the power supply 150, the switches 160 and 180, the energy storage element 120 can be configured to be a current source providing constant current between the first converter output terminal DC1 and the second converter output terminal DC2 of the voltage signal converter 110 for maintaining the sputtering rate and stability.

Moreover, in step 450, as in some embodiments of the present disclosure, at time interval t5, the control signals Q2 and Q3 have the low level, and the control signal Q1 remains having the high level, as in the embodiment shown in FIG. 3(e). The switch 180 is switched from the on state to the off state in response to the control signal Q3, while the switch 160 remains turned-on and the switch 170 remains turned-off. In this configuration, no voltage is outputted between the first voltage output terminals n1 and the second voltage output terminals n2. As shown in FIG. 2, the potential of the output voltage VO is 0 Volt.

Finally, in step 460, as some embodiments of the present disclosure, at time interval t6, the control signal Q3 has the low level and the control signals Q1 and Q2 have the high level, as in the embodiment shown in FIG. 3(f). The switch 170 is switched from the off state to the on state in response to the control signal Q2, while the switch 160 remains turned-on and the switch 180 remains turned-off, and no voltage is outputted between the first voltage output terminal n1 and the second voltage output terminal n2. As shown in FIG. 2, the potential of the output voltage VO is 0 Volt.

In some embodiments, after completing one cycle of steps 410 to 460, in response to the control signals Q1, Q2 and Q3, to switch the switches 160, 170 and 180, the power supply circuit 100 can continue outputting periodically, in response to the control signals Q1, Q2, and Q3, the positive voltage or the negative voltage as the output voltage in order to complete the sputtering process. In other words, after completing step 460, the control signal generating circuit 140 can continue generating the control signals Q1, Q2, and Q3 to execute steps 410 to 460 of the method of operating the power supply circuit 400 until the sputtering process is completed.

Moreover, the reference is made to FIG. 2 again. The control signal generating circuit 140 can adjust the frequency of each of the control signals Q1, Q2 and Q3 to control the switching of the switches 160, 170 and 180 in order to modify the frequency of the outputting the positive voltage and the negative voltage. For example, in some embodiments, when the frequencies of the control signals Q1, Q2 and Q3 are all f, the output frequencies of the positive voltage and the negative voltage are also f. In one application, to suppress the generation of the arc in the chamber, in order to accelerate the switching frequency of the positive voltage and the negative voltage in unit time internal to twice the original frequency, in this configuration, the frequencies of the control signals Q1, Q2 and Q3 can be modified to 2f so that the output frequency of the positive voltage and the negative voltage is modified to 2f correspondingly.

In addition, the control signal generating circuit 140 can further adjust a duty cycle of each of the control signals Q1, Q2 and Q3 to control the switching of the switches 160, 170, and 180, so that the time duration in which the positive voltage and the negative voltage are not outputted is modified. For example, as in the embodiment illustrated in FIG. 2, there is no voltage outputted (the voltage level of the output voltage VO is 0 Volt) at time intervals t2, t3, t5 and t6. Taking extending the time interval t5 (shortening time interval t4) as an example, the control signal generating circuit 140 can shorten the duty cycle of the control signal Q3 while maintaining the original duty cycle of the control signals Q1 and Q2 for the purpose of modifying the time duration in which the positive voltage and the negative voltage are not outputted. Alternatively stated, in some embodiments, the control signal generating circuit 140 can be configured to adjust the turn-on time of the power loop for outputting the positive voltage and the power loop for outputting the negative voltage by the control signals Q1, Q2, and Q3. For example, in some embodiments of the present disclosure, by shortening the duty cycle of the control signal Q3 while maintaining the original duty cycle of the control signals Q1 and Q2, the turn-on time of the power loop formed of the switches 160, 180 and the power supply 150 to output the positive voltage is shortened accordingly. Similarly, in some embodiments, by increasing the duty cycle of the control signal Q1 while maintaining the original duty cycle of the control signals Q2 and Q3, the turn-on time of the power loop formed of the energy storage element 120, the switch 170 and the voltage signal converter 110 to output the negative voltage is shortened accordingly. The discussion is given for illustrative purposes only and the implementation of the present disclosure is not limited thereto.

In some embodiments, a voltage magnitude of the output voltage VO can be adjusted by the configuration in which the switches 160, 170 and 180 are switched in response to the control signals Q1, Q2 and Q3. For example, referring again to FIG. 2, in some embodiments, the output voltage VO is adjusted to a voltage level having a negative potential at time interval t1. And then, at time intervals t2 and t3, the output voltage VO is adjusted to the voltage level of 0 Volt. Then, at time interval t4, the output voltage VO is adjusted to a voltage level with a positive potential. Finally, at time intervals t5 and t6, the output voltage VO is again adjusted to a voltage level of 0 Volt. It should be noted that in some embodiments, the voltage magnitude of the positive voltage can be much smaller than the voltage magnitude of the negative voltage. For example, the positive voltage can be 50 Volts while the negative voltage can be −20 kV.

In addition, as in the embodiment above, since the current output from the voltage signal converter 110 does not flow through the switch 180, in some practical applications, the switch 180 can be implemented by elements without high voltage endurance.

Through the operations of the various embodiments above, the power supply circuit and the method of operating thereof provided by the present disclosure can suppress the arc generated during the sputtering process in chamber by simply combining three switches with a tunable positive voltage power supply. At the same time, in this configuration, the voltage signal converter supplying the negative voltage is separated from the positive voltage power supply (that is, the current output from the voltage signal converter does not flow through the positive voltage power supply). Thereby the flexibility of the power supply circuit design is improved to meet the needs of various requirements of applications. The power supply circuit provided in the present disclosure is particularly suitable for the application in high power output sputtering systems.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. A power supply circuit, comprising:
   an energy storage element;
   a first switch, a first terminal of the first switch being coupled to a first terminal of the energy storage element at a first voltage output terminal;
   a voltage signal converter comprising a first converter output terminal and a second converter output terminal, wherein a second terminal of the energy storage element is coupled to the first converter output terminal, and a second terminal of the first switch is coupled to the second converter output terminal;
   a second switch, a first terminal of the second switch being coupled to the second terminal of the first switch;
   a third switch, a first terminal of the third switch being coupled to a second terminal of the second switch at a second voltage output terminal; and
   a power supply, a first terminal of the power supply being coupled to the first terminal of the second switch, a second terminal of the power supply being coupled to the second terminal of the third switch;
   wherein the energy storage element, the first switch, the second switch, the third switch, the voltage signal converter and the power supply are configured to cooperate to generate an output voltage at the first voltage output terminal and the second voltage output terminal.

2. The power supply circuit of claim 1, wherein
   when the second switch is turned off, the first switch and the third switch are turned on in response to a first control signal and a third control signal, respectively, and the power supply outputs a positive voltage as the output voltage.

3. The power supply circuit of claim 1, wherein
   the voltage signal converter is an AC-to-DC converter or a DC-to-DC converter, and the voltage signal converter is configured to output a negative voltage to the energy storage element.

4. The power supply circuit of claim 3, wherein
   when the first switch and the third switch are turned off, the second switch in response to a second control signal, is turned on, and the energy storage element outputs the negative voltage as the output voltage.

5. The power supply circuit of claim 1, further comprising:
   a control signal generating circuit coupled to a control terminal of each of the first switch, the second switch and the third switch, the control signal generating circuit being configured to generate a first control signal, a second control signal and a third control signal;
   wherein the first control signal, the second control signal and the third control signal are pulse width modulation signals.

6. The power supply circuit of claim 5, wherein
   when the first control signal and the third control signal have a high level and the second control signal has a low level, the output voltage is a positive voltage; and when the first control signal and the third control signal have the low level and the second control signal has the high level, the output voltage is a negative voltage.

7. The power supply circuit of claim 6, wherein when the first control signal and the second control signal have the high level and the third control signal has the low level, or the first control signal has the high level and the second control signal and the third control signal have the low level, no voltage is outputted at the first voltage output terminal and the second voltage output terminal.

8. A power supply circuit, comprising:
an energy storage element configured to receive an output voltage from a voltage signal converter and configured to generate a storage voltage;
a first switch coupled to the energy storage element at a first voltage output terminal;
a power supply configured to generate a supply voltage;
a second switch coupled between the power supply and a second voltage output terminal; and
a third switch coupled to the second switch at the second voltage output terminal, and coupled to the power supply and the first switch;
wherein the first switch, the second switch, and the power supply form a first power loop which outputs the supply voltage between the first voltage output terminal and the second voltage output terminal;
wherein the voltage signal converter, the energy storage element, and the third switch form a second power loop which outputs the storage voltage between the first voltage output terminal and the second voltage output terminal.

9. The power supply circuit of claim 8, wherein the supply voltage is a positive voltage, and the storage voltage is a negative voltage.

10. The power supply circuit of claim 8, wherein the first switch, the second switch and the third switch are configured to be switched in response to a first control signal, a second control signal and a third control signal respectively;
wherein the first control signal, the second control signal and the third control signal are pulse width modulation signals.

11. The power supply circuit of claim 10, further comprising:
a control signal generating circuit configured to generate the first control signal, the second control signal, and the third control signal, and configured to adjust a turn-on time of each one of the first power loop and the second power loop by the first control signal, the second control signal, and the third control signal.

12. The power supply circuit of claim 11, wherein when the first control signal and the second control signal have a high level, and the third control signal has a low level, the supply voltage is outputted.

13. The power supply circuit of claim 8, wherein when the first switch and the third switch are turned on and the second switch is turned off, or the first switch is turned on and the second switch and the third switch are turned off, no voltage is outputted between the first voltage output terminal and the second voltage output terminal.

14. A method of operating a power supply circuit, comprising:
by a control signal generating circuit, generating a first control signal, a second control signal and a third control signal; and
in response to the first control signal, the second control signal and the third control signal respectively, a first switch, a second switch and a third switch being turned on selectively;
wherein when the first switch and the third switch are turned off, and the second switch is turned on in response to the second control signal, an energy storage element outputs a negative voltage as an output voltage through the second switch and the energy storage element, and
when the second switch is turned off, the first switch, and the third switch are turned on in response to the first control signal and the third control signal respectively, a positive voltage is outputted as the output voltage by a power supply through the first switch and the third switch.

15. The method of operating the power supply circuit of claim 14, further comprising:
adjusting a frequency of each one of the first control signal, the second control signal and the third control signal to modify a frequency of the output voltage.

16. The method of operating the power supply circuit of claim 14, further comprising:
adjusting a duty cycle of each one of the first control signal, the second control signal and the third control signal to modify a time duration in which the positive voltage and the negative voltage are not output.

17. The method of operating the power supply circuit of claim 14, further comprising:
by switching the first switch, the second switch and the third switch, adjusting a voltage magnitude of the output voltage.

18. The method of operating the power supply circuit of claim 14, further comprising:
by adjusting the power supply, modifying a voltage level of the positive voltage.

19. The method of operating the power supply circuit of claim 14, wherein
when the first switch is turned on, the second switch and the third switch are configured to be switched respectively in response to the second control signal and the third control signal in order to output the positive voltage.

20. The method of operating the power supply circuit of claim 14, wherein
when the first control signal and the third control signal have a low level and the second control signal has a high level, the negative voltage is outputted as the output voltage.

* * * * *